United States Patent [19]

Lee et al.

[11] Patent Number: 4,973,976
[45] Date of Patent: Nov. 27, 1990

[54] MULTIPLEXING PARALLEL ANALOG-DIGITAL CONVERTER

[75] Inventors: Seong-Ho Lee; Sam-Yong Bang, both of Buchun, Rep. of Korea

[73] Assignee: Samsung Semiconductor and Telecommunications Co., Gumi, Rep. of Korea

[21] Appl. No.: 225,216

[22] Filed: Jul. 28, 1988

[30] Foreign Application Priority Data

Jul. 29, 1987 [KR] Rep. of Korea .................. 87-8282

[51] Int. Cl.$^5$ ........................................... H03M 1/14
[52] U.S. Cl. ................................ 341/141; 341/156; 341/163
[58] Field of Search ............... 341/141, 156, 161, 162, 341/163

[56] References Cited

U.S. PATENT DOCUMENTS

| 4,342,983 | 8/1982 | Weigand et al. | 341/156 |
| 4,612,533 | 9/1986 | Evans | 341/156 |
| 4,618,850 | 10/1986 | Lenhoff, Jr. | 341/141 |

Primary Examiner—William M. Shoop, Jr.
Assistant Examiner—Marc S. Hoff
Attorney, Agent, or Firm—Cushman, Darby & Cushman

[57] ABSTRACT

A multiplexing parallel analog digital converter including two multiplexers, comparators, a demultiplexer, and a control unit. One multiplexer is provided the reference voltages resulting from a voltage division of inner resistors by a most significant bit reference ladder and a least significant bit reference ladder for the reference voltage of the next comparison. The other multiplexer is provided the reference voltages by accepting an analog input signal and the difference signal between an analog input signal and the output of a 4-bit digital analog converter. By using two multiplexers, only one analog digital converter is needed in this present device, so, the number of comparators is reduced. The multiplexer sends the digital signals compared with the most significant bit signal and the least significant bit signal, respectively, to a most significant output latch and a least significant output latch, respectively, so the 8-bit digital signal is obtained. The control unit is a logic circuit composed of flip-flops and gates, and provides clock signals for the sequential operation of the circuits, such as the operations of the multiplexers.

6 Claims, 3 Drawing Sheets

MULTIPLEXING PARALLEL ANALOG-DIGITAL CONVERTER

BACKGROUND OF THE INVENTION

This invention relates to an Analog-Digital Converter(ADC) and more particularly to a parallel ADC which adopts a multiplexing technique.

Currently, development is well underway of high speed ADC's as the industries related to high speed digital signal processing, such as video, radar and image enhancement, etc., make progress. One of the typical examples is the all-parallel ADC which is widely used for various industrial fields, but requires use of a plurality of comparators. That is, since $2^N-1$ comparators are necessary for N-bit output, there are several shortcomings, such as a wide chip area for integration, a large input load effect, and high power dissipation.

Therefore, a half-parallel ADC, which requires the use of $2 \times (2^{N/2}-1)$ comparators for N-bit output, has been proposed for compensating for the above-mentioned shortcomings, but there is much room for further improvements.

SUMMARY OF THE INVENTION

This invention is devised for overcoming the above-mentioned shortcomings of the conventional ADC's. It is the principal object of this invention to provide an improved ADC having superior properties in chip size, speed and power dissipation compared with the conventional ADC's, which contain $2^{N/2}-1$ comparators for N bit output, by using a multiplexer.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

Detailed Description

Key to the symbols used for designating major elements in the description and drawings:
1, 21, 22: Most significant bit reference ladder
2, 23, 24: Least significant bit reference ladder
MUX 1, MUX 2: Multiplexer
DEMUX: Demultiplexer
3: 4-bit all-parallel ADC
5, 5', 5'': Subtracter
6: 4-bit DAC
11, 31, 32: Most significant 4-bit output latch
12, 33, 34: Least significant 4-bit output latch
15: Control unit Referring to FIG. 1, showing a conventional half-parallel ADC, and to FIG. 2 showing an ADC of the invention, a detailed explanation of the invention will now be provided.

In FIG. 17 on the conventional 8-bit half-parallel ADC, the most significant 4-bit of the analog input is determined by 15 comparators and a decoding logic circuit, and then the least significant 4-bit is determined by an all-parallel ADC accepting the difference signal of the analog input signal and output signal of the 4-bit ADC accepting the determined most significant 4-bit. However, two-times more comparators are necessary in this type ADC, than in a multiplexing parallel ADC constructed in accordance with principles of the present invention, because this prior art ADC uses two 4-bit all-parallel ADC's 3,3'.

Figure 1:
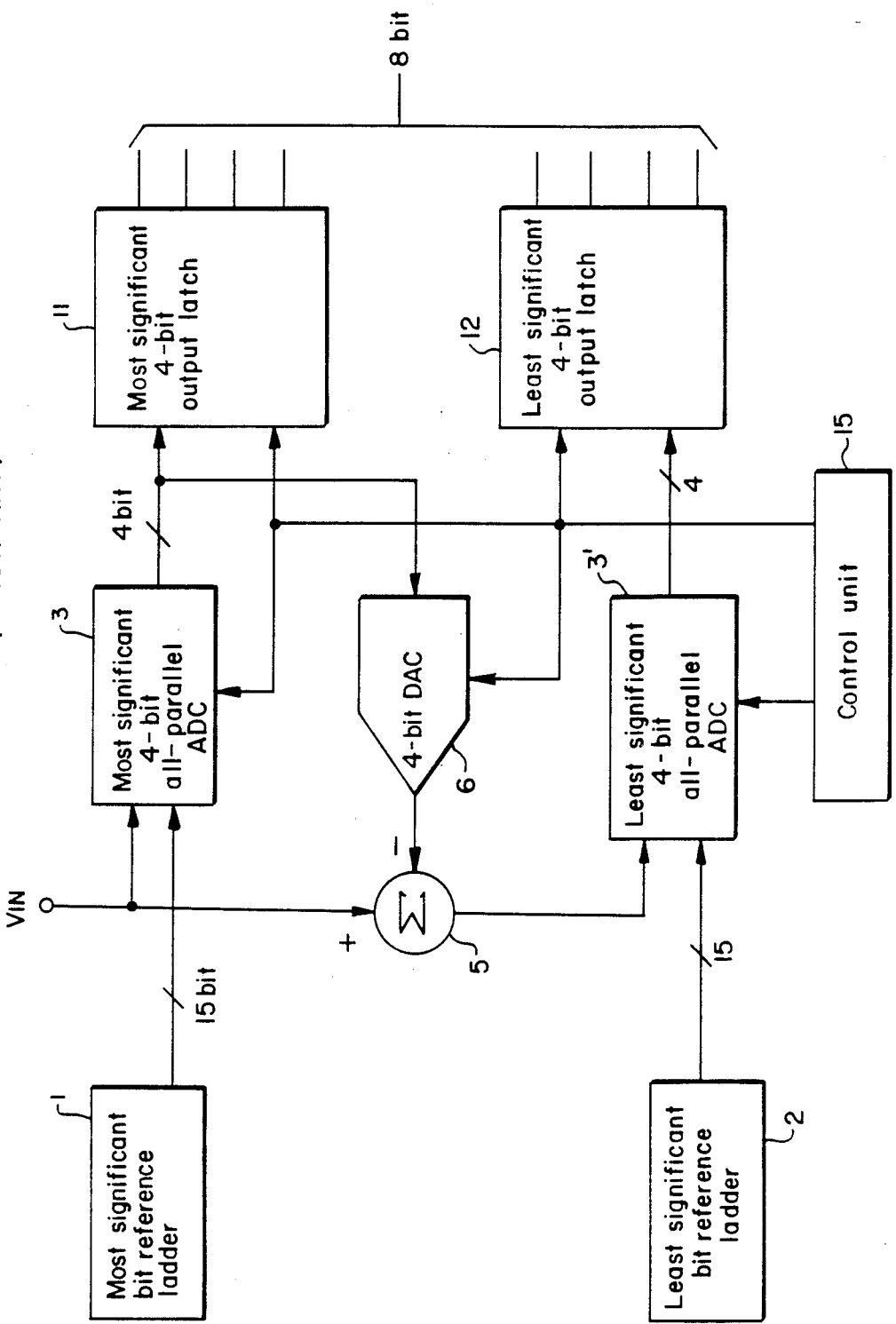
FIG. 1 is the block diagram showing a conventional half-parallel ADC.
Figure 2:
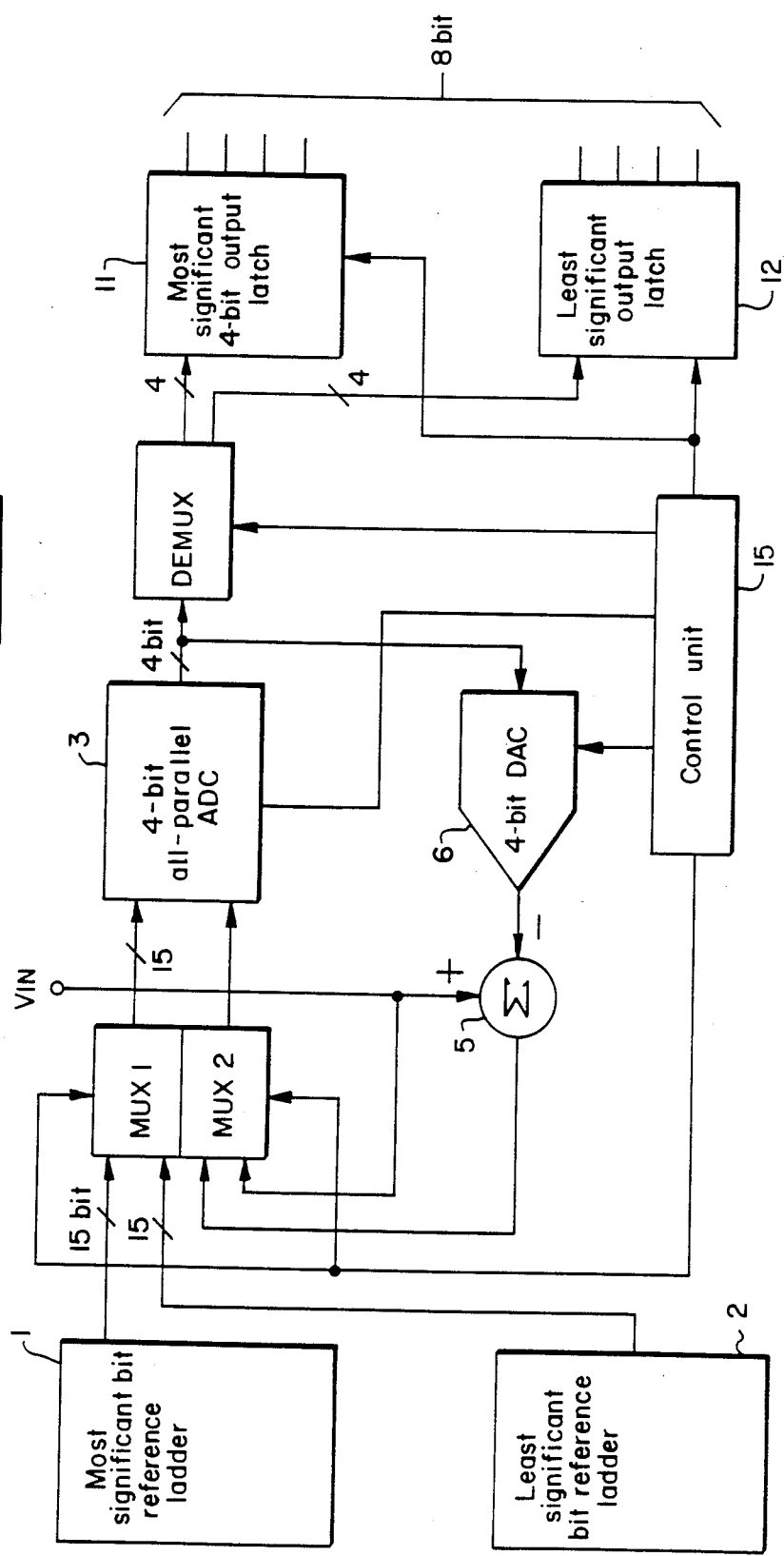
FIG. 2 is a block diagram showing an 8-bit output ADC of the present invention.

An 8-bit output ADC of the present invention, as shown in FIG. 2, has the same 8-bit output as the half-parallel ADC in FIG. 1. The most significant bit reference ladder 1 and least significant bit reference ladder 2 are connected to a multiplexer MUX 1 and the output of the multiplexer MUX 1 is transmitted to a 4-bit all-parallel ADC 3. The most significant bit reference ladder 1 and the least significant bit reference ladder 2 have several resistors to provide analog reference voltages by voltage division, and sixteen, resistors form the ladder to provide the reference voltages when fifteen outputs are necessary. The MUX 2 accepts the analog input signal $V_{IN}$ and the difference signal of analog input signal $V_{IN}$ and the output of the 4-bit DAC 6 as inputs, and it is connected to the 4-bit all-parallel ADC 3 through subtracter 5. The 4-bit all-parallel ADC 3 is composed of fifteen comparators accepting an input signal and fifteen reference voltages as their inputs. The output of the 4-bit all-parallel ADC 3 is transmitted to DEMUX and 4-bit DAC 6, and output of DEMUX is provided as an 8-bit output signal through the most significant 4-bit output latch, 11 and the least significant 4-bit output latch 12, which are composed of respective tri-state D-flip-flops. The control unit 15 is a logic circuit, composed of flip-flops and gates, and provides a clock signal to each circuit for the sequential operation of the circuits as the operations of MUX 1 and MUX 2 are repeated.

The operation of the FIG. 2 embodiment of the invention will now be explained. The most significant bit reference ladder 1 and least significant bit reference ladder 2 provide the reference voltages by the voltage division of inner resistors to MUX 1 for the reference voltage of the next comparison. The most significant bit reference, signal is a finite quantization of the comparing reference and the least significant bit reference signal is the requantized signal in reference to the most significant bit reference signal.(For example, in decimal numbers, when the most significant reference signals correspond to 10, 20, 30 . . . , the least significant reference signals are 1, 2, 3 . . .). The MUX 1 transmits the most significant bit reference ladder 1 and the least significant bit reference ladder 2 to the 4-bit all-parallel ADC 3 as the control unit 15 provides H-level and L-level clock signals, respectively. The MUX 2, to which the same clock signal of control unit 15 is applied, transmits analog input signal $V_{IN}$, and the output signal subtracter 5, which is the difference signal of the analog input signal $V_{IN}$ and output signal of 4-bit DAC 6, to all-parallel ADC 3. Therefore, the analog input signal $V_{IN}$ and the reference voltages of the most and least significant bit reference ladders 1, 2 are compared together in inner comparators of 4-bit all-parallel ADC 3 according to the clock of control unit 15. First, analog input signal $V_{IN}$ and a most significant bit reference signal are compared and the resulting output is provided to DEMUX. The first compared signal of the 4-bit all-parallel ADC 3 is fedback to the 4-bit DAC 6 and converted to an analog input signal to subtracter 5 to provide the next comparing signal.

That is, the difference signal of analog input signal $V_{IN}$ and the first comparing signal, which is the analog output signal of subtracter 5, is fed into the 4-bit all-parallel ADC 3 through MUX 2 for the second comparison, and it is compared with the reference voltage of the least significant reference ladder propagating through MUX 1. The result is provided to DEMUX. DEMUX sends the digital signal, which is compared with the most significant bit signal, to the most significant output latch 11, and also sends the digital signal, which is compared with the least significant bit signal, to the least significant output latch 12 to provide the 8-bit digital output. The latch keeps the output until the next input signal is applied.

Although the basic operating principle of the invention is the same as that of the half-parallel ADC of FIG. 1, the principles of the present invention permit simplification of circuit by using only one 4-bit all-parallel ADC 3. This simplification is made possible by using the multiplexer to send the most significant 4-bit reference voltage and the analog input signal for the determination of the most significant 4-bit, and the least significant 4-bit reference voltage and the difference signal of the analog input signal $V_{IN}$ and analog output of DAC 6 of the most significant 4-bit for the determination of the least significant 4-bit, to the 4-bit all-parallel ADC. The output of the 4-bit all-parallel ADC is provided to DEMUX and its output is transmitted to the most significant 4-bit output latch and the least significant 4-bit output latch to provide the 8-bit digital signal.

Even if the circuit of the invention comprising MUX 1, MUX 2 and DEMUX seems to be complicated in comparison to the conventional half-parallel ADC, it is possible to decrease the chip size and to enhance the performance because the number of the comparators and decoding logic circuits, which are the elements which consume the chip area cause much of the, power dissipation and most (namely about 70 percent) of the input load effect, decrease by half.

Figure 3:
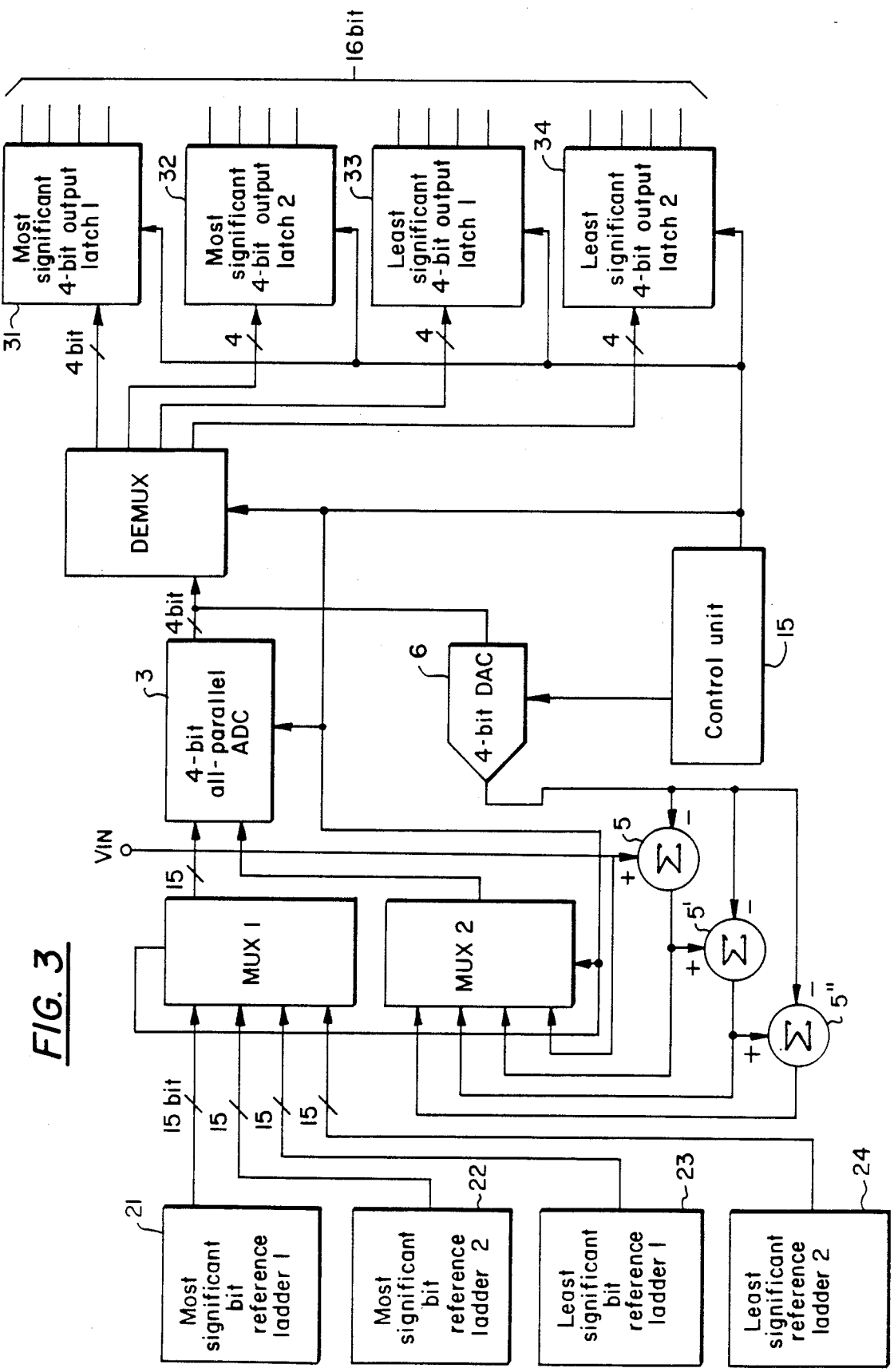
FIG. 3 is a block diagram showing a 16-bit output ADC of present the invention.

A 16-bit output ADC of the invention in FIG. 3, which would be impossible to implement by conventional all-parallel ADC because it would need $2^{16}$-1(65535) comparators, can be implemented easily. Although the outputs are 16-bits as shown in FIG. 3, it is possible to reduce the number of comparators by using only one 4-bit all-parallel ADC 3. In this case, most significant reference signal can be obtained by the most significant reference ladders 21, 22, and least significant reference signal can be obtained by the least significant reference ladders 23, 24. These reference signals are controlled by control unit 15 to compare them with analog input signal $V_{IN}$ through MUX 1 and MUX 2 sequentially. The next comparing signals fed back to the 4-bit- DAC 6 are provided to 4-bit all-parallel ADC 3 through subtracters 5, 5', 5" sequentially. The resulting MSB and LSB outputs are provided as 16-bit digital data signal through DEMUX In addition, for the implementation of 12-bit ADC, 3×4 bit or 2×6 bit-type can be selected being based on the consideration of chip size and conversion speed.

As mentioned before in detail, following the concept of this invention, it is possible to reduce the number of comparators in a conventional all-parallel ADC and a half-parallel ADC for the improvement of the chip size, conversion speed and power dissipation in the integration of ADC.

What is claimed is:

1. A multiplexing parallel analog-digital converter, comprising:
   a first multiplexer in which a reference voltage is applied from means supplying a most significant bit reference voltage and means supplying a least significant bit reference voltage;
   a second multiplexer in which a difference signal of an analog input signal $V_{IN}$ and an output of a 4-bit digital-analog converter is fed back;
   comparing means in which the outputs of said first and second multiplexers are compared;
   a demultiplexer which provides outputs of said comparing means as a most significant bit signal and a least significant bit signal; and
   a control unit which controls all functions of said analog-digital converter in multiplexing control.

2. A multiplexing parallel analog-digital converter according to claim 1, wherein:
   the supplying means of the input most significant bit reference voltage and least significant bit reference voltage are respectively composed of a most significant bit reference ladder and a least significant bit reference ladder, the output most significant bit signal and least significant bit signal being composed of a most significant 4-bit output latch and a least significant 4-bit output latch, and a digital 8-bit data signal is provided therein.

3. A multiplexing parallel analog-digital converter according to claim 1, wherein:
   the supplying means of the input most significant bit reference voltage and the least significant bit reference voltage are composed of two most significant bit reference ladders, and two least significant bit reference ladders, said output most significant bit signal and least significant bit signal being respectively composed of two most significant 4-bit output latches and two least significant 4-bit output latches, and a digital 16-bit data signal is provided therein.

4. A multiplexing parallel analog-digital converter according to claim 1, wherein:
   said comparing means in which the outputs of said first and second multiplexers are compared includes only one 4-bit all-parallel analog-digital converter.

5. A multiplexing parallel analog-digital converter according to claim 1, wherein:
   a subtracter which feeds back the difference signal of said analog input signal $V_{IN}$ and the output of the 4-bit digital-analog converter, adds said analog input signal $V_{IN}$ and subtracts the output signal of said 4-bit digital analog converter.

6. A multiplexing parallel analog-digital converter according to claim 5, wherein:
   at least one additional subtracter is provided in parallel with said subtracter to feed back comparing signals sequentially as the number of outputs of digital data are correspondingly increased.

* * * * *